(12) United States Patent
Yamada

(10) Patent No.: US 7,612,812 B2
(45) Date of Patent: Nov. 3, 2009

(54) SOLID STATE IMAGING DEVICE WITH INCREASED VERTICAL RESOLUTION IN INTERLACE SCANNING METHOD

(75) Inventor: Tetsuo Yamada, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 534 days.

(21) Appl. No.: 11/057,751

(22) Filed: Feb. 15, 2005

(65) Prior Publication Data
US 2005/0179798 A1 Aug. 18, 2005

(30) Foreign Application Priority Data
Feb. 16, 2004 (JP) ............................. 2004-038266

(51) Int. Cl.
*H04N 3/14* (2006.01)
*H04N 5/335* (2006.01)
*H04N 9/04* (2006.01)

(52) U.S. Cl. ...................................... 348/275; 348/315
(58) Field of Classification Search .............. 348/220.1, 348/272, 273, 275, 280, 315, 320, 322
See application file for complete search history.

(56) References Cited

U.S. PATENT DOCUMENTS

| | | | | |
|---|---|---|---|---|
| 4,460,919 A * | 7/1984 | Takemura | ................. | 348/277 |
| 4,477,832 A * | 10/1984 | Takemura | ................. | 348/277 |
| 4,818,865 A * | 4/1989 | Matsui et al. | ............ | 250/201.2 |
| 5,457,494 A | 10/1995 | Suga et al. | | |
| 6,169,577 B1 * | 1/2001 | Iizuka | ................. | 348/315 |
| 6,236,434 B1 | 5/2001 | Yamada | ................. | 348/315 |
| 6,423,959 B1 * | 7/2002 | Ikeda et al. | ................. | 348/322 |
| 6,519,000 B1 * | 2/2003 | Udagawa | ................. | 348/322 |
| 6,661,451 B1 * | 12/2003 | Kijima et al. | ................. | 348/322 |
| 6,686,960 B2 * | 2/2004 | Iizuka | ................. | 348/273 |
| 6,750,911 B1 * | 6/2004 | Kobayashi et al. | ......... | 348/322 |

(Continued)

FOREIGN PATENT DOCUMENTS

JP 05300437 A * 11/1993

(Continued)

OTHER PUBLICATIONS

Furumiya et al.; "A 30 Frame/s ⅔ Inch 1.3M Pixel Progressive Scan IT-CCD Image Sensor"; Sep. 2001; IEEE Transactions on Electron Devices; vol. 48, Issue 9; pp. 1922-1928.*

(Continued)

*Primary Examiner*—John M Villecco
(74) *Attorney, Agent, or Firm*—Arent Fox LLP

(57) ABSTRACT

A solid state imaging device comprises a semiconductor substrate defining a two-dimensional surface, a plurality of photoelectric conversion elements disposed in a light receiving area of said semiconductor substrate in a plurality of rows and columns, an electric charge read-out device that reads out signal electric charges accumulated in said plurality of photoelectric conversion elements in interlace by dividing the signal electric charges in a plurality of fields, each field at least including the signal electric charges accumulated in the vertically adjacent photoelectric conversion elements corresponding to one color, and a vertical adding device that adds, for each field, the read-out signal electric charges divided into the plurality of fields. A solid state imaging device that can increase vertical resolution at a time of an interlace operation is provided.

7 Claims, 13 Drawing Sheets

U.S. PATENT DOCUMENTS

| | | | |
|---|---|---|---|
| 6,757,015 B2 * | 6/2004 | Inokuma et al. | 348/273 |
| 6,850,277 B1 * | 2/2005 | Misawa | 348/315 |
| 6,876,388 B1 * | 4/2005 | Lee et al. | 348/308 |
| 6,930,716 B2 * | 8/2005 | Yoshida | 348/322 |
| 6,992,714 B1 * | 1/2006 | Hashimoto et al. | 348/273 |
| 7,038,723 B1 * | 5/2006 | Kuroda et al. | 348/322 |
| 7,202,900 B2 * | 4/2007 | Glenn | 348/315 |
| 2003/0193580 A1 * | 10/2003 | Okamoto | 348/222.1 |
| 2008/0316326 A1 * | 12/2008 | Wada | 348/222.1 |

FOREIGN PATENT DOCUMENTS

| | | |
|---|---|---|
| JP | 06153083 A * | 5/1994 |
| JP | 10-136391 | 5/1998 |
| JP | 2000-308076 A | 11/2000 |
| JP | 2002-112119 | 4/2002 |
| JP | 2004-048799 A | 2/2004 |

OTHER PUBLICATIONS

Yamada et al., "MP 6.5 A Progressive Scan CCD Imager for DSC Applications", 2000 IEEE International Solid-State Circuits Conference Digest of Technical Papers, First Edition, pp. 110-111 (Feb. 2000).

English language version of the Japanese Office Action dated May 20, 2008, 2 pages.

* cited by examiner

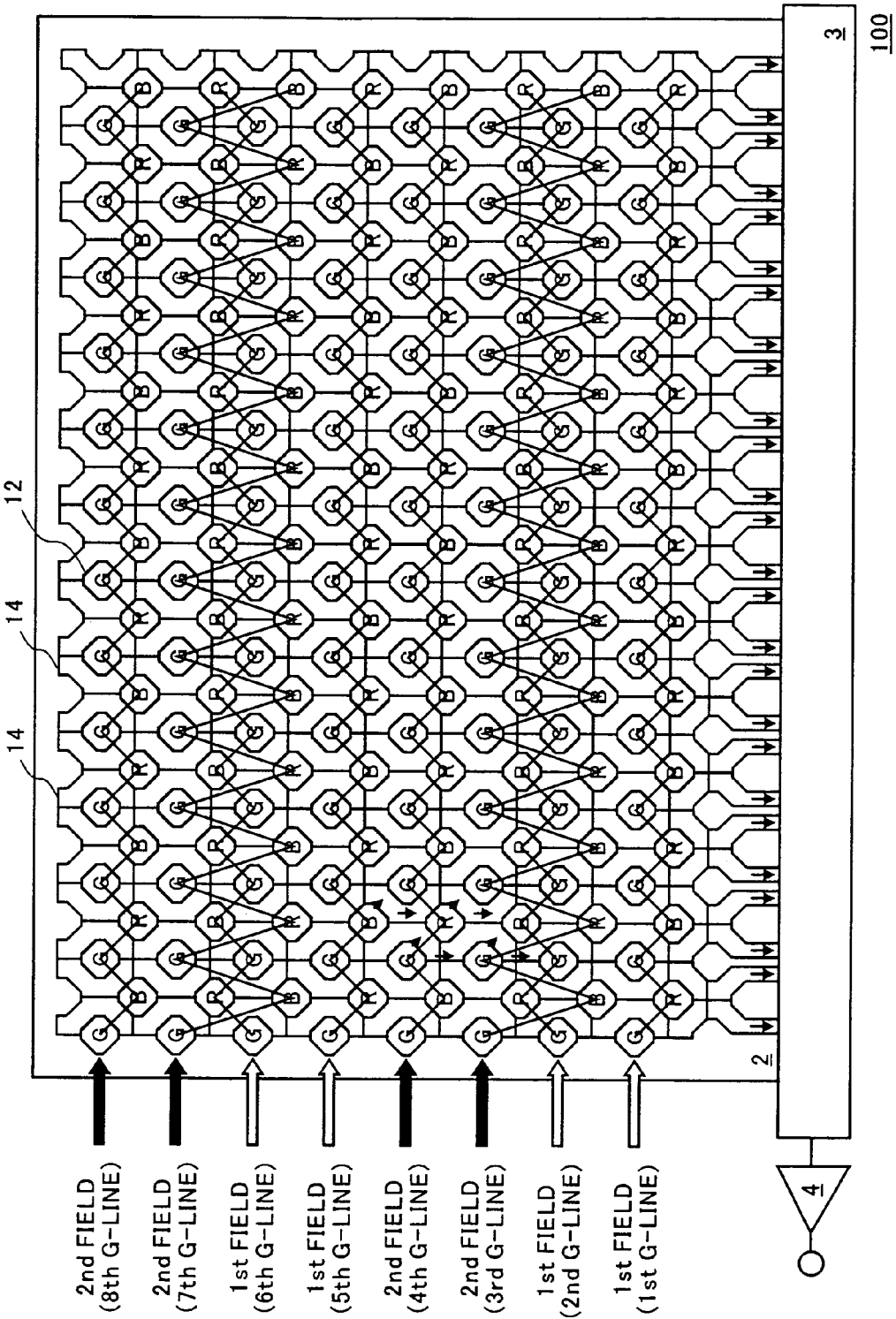

FIG. 2A

```
1st G-LINE  G  R  G  B  G  R  G  B
            +  +  +  +  +  +  +  +
2nd G-LINE  G  R  G  B  G  R  G  B

5th G-LINE  G  R  G  B  G  R  G  B
            +  +  +  +  +  +  +  +
6th G-LINE  G  R  G  B  G  R  G  B
```

FIG. 2B

```
3rd G-LINE  G  B  G  R  G  B  G  R
            +  +  +  +  +  +  +  +
4th G-LINE  G  B  G  R  G  B  G  R

7th G-LINE  G  B  G  R  G  B  G  R
            +  +  +  +  +  +  +  +
8th G-LINE  G  B  G  R  G  B  G  R
```

FIG. 2C

```
1st+2nd G-LINES   2G  2R  2G  2B  2G  2R  2G  2B
3rd+4th G-LINES   2G  2B  2G  2R  2G  2B  2G  2R
5th+6th G-LINES   2G  2R  2G  2B  2G  2R  2G  2B
7th+8th G-LINES   2G  2B  2G  2R  2G  2B  2G  2R
```

FIG. 2D

FIG. 6A
```
1st G-LINE  G  R  G  B  G  R  G  B
            +  +  +  +  +  +  +  +
2nd G-LINE  G  R  G  B  G  R  G  B
5th G-LINE  G  R  G  B  G  R  G  B
            +  +  +  +  +  +  +  +
6th G-LINE  G  R  G  B  G  R  G  B
```
FIG. 6B
```
3rd G-LINE  G  B  G  R  G  B  G  R
            +  +  +  +  +  +  +  +
4th G-LINE  G  B  G  R  G  B  G  R
7th G-LINE  G  B  G  R  G  B  G  R
            +  +  +  +  +  +  +  +
8th G-LINE  G  B  G  R  G  B  G  R
```
FIG. 6C
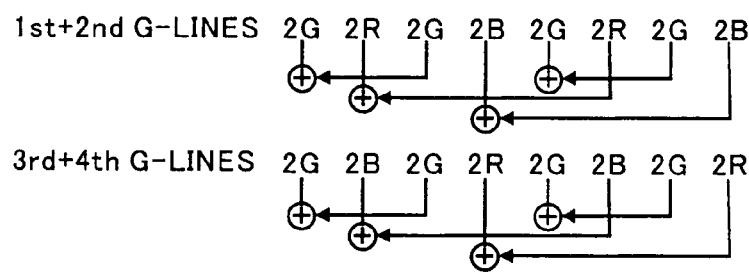
FIG. 6D
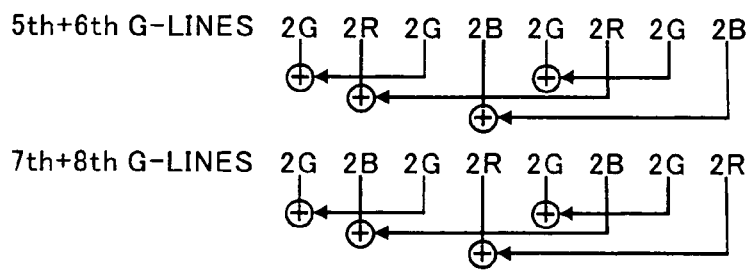
FIG. 6E
```
1st+2nd G-LINES  4G  4R  4G  4B
3rd+4th G-LINES  4G  4B  4G  4R
5th+6th G-LINES  4G  4R  4G  4B
7th+8th G-LINES  4G  4B  4G  4R
```

FIG. 8A

```
1st G-LINE  G  R  G  B  G  R  G  B
            +  +  +  +  +  +  +  +
2nd G-LINE  G  R  G  B  G  R  G  B

5th G-LINE  G  R  G  B  G  R  G  B
            +  +  +  +  +  +  +  +
6th G-LINE  G  R  G  B  G  R  G  B
```

FIG. 8B

```
3rd G-LINE  G  B  G  R  G  B  G  R
            +  +  +  +  +  +  +  +
4th G-LINE  G  B  G  R  G  B  G  R

7th G-LINE  G  B  G  R  G  B  G  R
            +  +  +  +  +  +  +  +
8th G-LINE  G  B  G  R  G  B  G  R
```

FIG. 8C

```
1st+2nd G-LINES  2G  2R  2G  2B  2G  2R  2G  2B
3rd+4th G-LINES  2G  2B  2G  2R  2G  2B  2G  2R
5th+6th G-LINES  2G  2R  2G  2B  2G  2R  2G  2B
7th+8th G-LINES  2G  2B  2G  2R  2G  2B  2G  2R
```

FIG. 8D

```
CENTERS OF G ⇒    G  B   G  R   G  B   G  R
                  G  R   G  B   G  R   G  B
CENTERS OF G →    G  B   G  R   G  B   G  R
                  G  R   G  B   G  R   G  B
CENTERS OF G ⇒    G  B   G  R   G  B   G  R
                  G  R   G  B   G  R   G  B
CENTERS OF G →    G  B   G  R   G  B   G  R
                  G  R   G  B   G  R   G  B
```

VERTICAL DIRECTION

VERTICAL DIRECTION

CENTERS OF G ⇨
CENTERS OF G ⮕

CENTERS OF G ⇨
CENTERS OF G ⮕

```
1st G-LINE  G  R  G  B  G  R  G  B
            +  +  +  +  +  +  +  +
3rd G-LINE  G  R  G  B  G  R  G  B

5th G-LINE  G  R  G  B  G  R  G  B
            +  +  +  +  +  +  +  +
7th G-LINE  G  R  G  B  G  R  G  B
```

```
2nd G-LINE  G  B  G  R  G  B  G  R
            +  +  +  +  +  +  +  +
4th G-LINE  G  B  G  R  G  B  G  R

6th G-LINE  G  B  G  R  G  B  G  R
            +  +  +  +  +  +  +  +
8th G-LINE  G  B  G  R  G  B  G  R
```

```
1st+3rd G-LINES   2G  2R  2G  2B  2G  2R  2G  2B
2nd+4th G-LINES   2G  2B  2G  2R  2G  2B  2G  2R
5th+7th G-LINES   2G  2R  2G  2B  2G  2R  2G  2B
6th+8th G-LINES   2G  2B  2G  2R  2G  2B  2G  2R
```

SOLID STATE IMAGING DEVICE WITH INCREASED VERTICAL RESOLUTION IN INTERLACE SCANNING METHOD

CROSS REFERENCE TO RELATED APPLICATION

This application is based on Japanese Patent Application 2004-038266, filed on Feb. 16, 2004, the entire contents of which are incorporated herein by reference.

BACKGROUND OF THE INVENTION

A) Field of the Invention

This invention relates to a solid state imaging device, especially to a structure of a solid state imaging device for a digital still camera.

B) Description of the Related Art

FIG. 10 is a schematic plan view of a conventional solid state imaging device 800.

The solid state imaging device 800 is the most commonly used interlace-type CCD (ITCCD) as a conventional solid state imaging device. A large number of photoelectric conversion elements (pixels) 812 are arranged in a tetragonal matrix in a light receiving region 802. A vertical electric charge transfer device (vertical charge coupled device: VCCD) 814 that reads out signal charges generated at the photoelectric conversion elements 812 and vertically transfers is formed including transfer electrodes and a vertical transfer channel for each column of the photoelectric conversion elements 812 and transfers the signal charges generated at photoelectric conversion elements 12 in a vertical direction.

In the drawing, a horizontal electric charge transfer device (horizontal charge coupled device: HCCD) 803 that transfers electric charges transferred by the VCCD 814 to a peripheral circuit 804 line by line is formed under the light receiving region 802. Also, pixel lines on lines indicated with white arrows are first field lines in an interlace scanning method, and pixel lines on lines indicated with black arrows are second field lines.

A color filter arrangement corresponding to each pixel is presented with letters "R, G and B" in each pixel. Here in this specification, R, G and B respectively indicate red, green and blue. The color filter arrangement adopted in this solid state imaging device 800 is so-called Bayer arrangement and generally used for the solid state imaging device as an imaging device for a digital still camera (DSC).

FIG. 11 is a schematic plan view of a conventional solid state imaging device 900.

The solid state imaging device 900 is composed including a light receiving region 902 including vertical electric charge transfer devices (VCCD) 914 that vertically transfer signal charges generated at a large number of photoelectric conversion elements 912 and the photoelectric conversion elements, a horizontal electric charge transfer device (HCCD) that horizontally transfers the signal charges transferred by the VCCDs 914 and an output amplifier 904.

The receiving light region 902 of the solid state imaging device to which Pixel Interleaved Array CCD (PIACCD) is adopted as shown in the drawing has a large number of pixels arranged in the pixel interleaved arrangement. In each interval of columns of photoelectric conversion elements 912, a vertical electric charge transfer device 914 that reads out the signal charges generated at the photoelectric conversion elements 912 and vertically transfers is provided with vertically winding a space between the columns of the photoelectric conversion elements 912. A transfer channel is positioned to the winding space formed by the pixel interleaved arrangement, and adjacent transfer channels are separated via the photoelectric conversion elements and come closer via the channel stop region 903 (for example, refer to JP-A Hei10-136391 (patent document 1) and Tetsuo Yamada and others, "A Progressive Scan CCD Imager for DSC Applications", ISSCC Digest of Technical Papers, February, 2002, Page 110 (non-patent document 1)).

Each of the vertical electric charge transfer device 914 is formed including a vertical transfer channel (not shown in the drawing) and transfer electrodes formed to a horizontal direction over the vertical transfer channel via an insulating film (not shown in the drawing) winding a space between horizontally adjacent photoelectric conversion elements 912.

In the drawing, the color of the color filter (for example, green, blue or red) corresponding to each pixel is indicated by the letter G, B and R in each of the pixels 912. Also, pixel lines on lines indicated with white arrows are first field lines in the interlace scanning method, and pixel lines on lines indicated with blacks arrow are second field lines.

When the signals for the first field lines are read, the first G-line and the third G-line, and the fifth G-line and the seventh G-line are read. When the signals for the second field lines are read, the second G-line and the fourth G-line, the sixth G-line and the eighth G-line are read. As shown in the drawing, each G-line is formed along a solid line repeatedly connecting a center of each pixel.

FIG. 12A to FIG. 12D are diagrams showing signal arrangements read by the conventional ITCCD solid state imaging device 800.

FIG. 12A is a diagram showing a signal arrangement of the first field, and FIG. 12B is a diagram showing a signal arrangement of the second field. Both of the first field and the second field add same colored signals in every two lines. As a result, as shown in FIG. 12C, a signal arrangement of a vertical two-pixel addition field synthesized frame generated by synthesizing each field after the vertical addition can be obtained. Moreover, the conventional reading method for the ITCCD cannot reproduce a colored motion picture. Because each field includes only two types of signals such as G and R color signals or G and B color signals, one field cannot generate color signals including all of R, G, and B color signals. Since the color signal including R, G and B can be naturally generated after the field synthesis, the color signal after the synthesis, for example, can be used for a still picture with decreased number of pixels. In this case, sensitivity will be about twice by the addition of the signals.

FIG. 12D is a diagram showing spatial sampling centers after the vertical additions. The sampling points of G formed by the vertical addition of the first field with the Bayer Arrangement will be on lines indicated by white arrows, and the sampling points of G formed by the vertical addition of the second field with the Bayer Arrangement will be on lines indicated by black arrows. As obvious from the drawing, the sampling centers of the G signals after the vertical additions do not have regular intervals. Also, since the spatial sampling centers overlap with each another in wide areas, resolution obtained for the number of the sampling points will be lowered.

FIG. 13A to FIG. 13D are diagrams showing signal arrangements read by the conventional PIACCD solid state imaging device 900.

FIG. 13A is a diagram showing a signal arrangement of the first field, and FIG. 13B is a diagram showing a signal arrangement of the second field. In the first field, the first G-line and the third G-line are added, and the fifth G-line and the seventh G-line are added. In the second field, the second G-line and the fourth G-line are added, and the sixth G-line and the eighth G-line are added. As a result, as shown in FIG. 13C, a signal arrangement of a vertical two-pixel addition field synthesized frame generated by synthesizing each field after the vertical addition can be obtained. Moreover, it is different from the conventional reading method for the ITCCD because each field includes color signal for all colors of RGB. Therefore, the color signals of RGB can be generated in one field, and colored motion picture signals can be generated.

FIG. 13D is a diagram showing spatial sampling centers after the vertical additions. The sampling points of G obtained by the vertical addition of the first field with this conventional solid state imaging device 900 are on a line indicated by white arrow, and those by the vertical addition of the second field are on a line indicated by black arrow. That is, as same as the case of the conventional solid state imaging device 800 shown in FIG. 12D, the sampling centers of the G signals after the vertical additions do not have regular intervals. Also, since spatial sampling ranges of the adjoining sampling points are overlapped each another in a wide range, resolution obtained for the number of the sampling points will be lowered.

As described in the above, in the conventional vertical addition method, vertical resolution after the addition synthesis does not reach less than ½ of that before the addition synthesis and decreases about ¼. Therefore, although the sensitivity can be increased by the vertical addition in the interlace operation of the conventional vertical addition method, the vertical resolution may be lowered.

SUMMARY OF THE INVENTION

It is an object of the present invention to provide a solid state imaging device that can increase vertical resolution in an interlace operation.

According to one aspect of the present invention, there is provided a solid state imaging device comprising: a semiconductor substrate defining a two-dimensional surface; a plurality of photoelectric conversion elements disposed in a light receiving area of said semiconductor substrate in a plurality of rows and columns; an electric charge read-out device that reads out signal electric charges accumulated in said plurality of photoelectric conversion elements in interlace by dividing the signal electric charges in a plurality of fields, each field at least including the signal electric charges accumulated in the vertically adjacent photoelectric conversion elements corresponding to one color; and a vertical adding device that adds, for each field, the read-out signal electric charges divided into the plurality of fields.

According to the present invention, there is provided a solid state imaging device that can increase vertical resolution at a time of an interlace operation.

BRIEF DESCRIPTION OF THE DRAWINGS

FIG. 1 is a schematic plan view of a solid state imaging device 100 according to a first embodiment of the present invention.

FIG. 2A-2D are diagrams showing signal arrangement of the first and second fields read by the solid state imaging device 100 according to the first embodiment of the present invention.

FIG. 6A to FIG. 6E are diagrams showing signal arrangements read by the solid state imaging device 100 according to the third embodiment of the present invention.

FIG. 8A to FIG. 8D are diagrams showing signal arrangements read by the solid state imaging device 400 according to the fourth embodiment of the present invention.

FIG. 12A to FIG. 12D are diagrams showing signal arrangements read by the conventional ITCCD solid state imaging device 800.

DETAILED DESCRIPTION OF THE PREFERRED EMBODIMENTS

FIG. 1 is a schematic plan view of a solid state imaging device 100 according to a first embodiment of the present invention.

A solid state imaging device 100 at least includes a receiving region 2 having a large number of photoelectric conversion elements 12 and a vertical electric charge transfer device (vertical charge coupled device: VCCD) 14 that vertically transfers signal charge generated by the photoelectric conversion elements 12, a horizontal electric charge transfer device (horizontal charge coupled device: HCCD) 3 that horizontally transfers the signal charge transferred by the VCCD 14 and an output amplifier 4.

The light receiving region 2 of the solid-state imaging device 100 is consisted of the photoelectric conversion elements 12 disposed in a matrix with a so-called pixel interleaved arrangement (PIA) or a honeycomb arrangement. In this specification, "the pixel interleaved arrangement (PIA) represents an arrangement wherein a first lattice of a two-dimensional tetragonal matrix and a second lattice having each apex disposed on a center of apices of the first lattice. For example, the photoelectric conversion elements 12 in the even number columns (lines) and in the odd number columns (lines) are shifted in the horizontal (vertical) direction by about a half of horizontal (vertical) pitch of the photoelectric conversion elements 12, and each column (line) of the photoelectric conversion elements 12 includes the photoelectric conversion elements 12 in only an even number line (column) or an odd number line (column).

The expression "about a half" pitch is intended to include not only an exact half pitch but also a substantially equal to the exact half pitch that can be considered as a half pitch from the performance and image quality of a manufactured solid state imaging device although the pitch may be different from the exact half pitch. That is because the pitch of the photoelectric conversion elements may vary from manufacture tolerances, rounding errors of pixel positions caused by a design or a mask formation, or the like. The above "a half pitch of photoelectric conversion elements 12 in the line of photoelectric conversion element" is the same.

Figure 3:
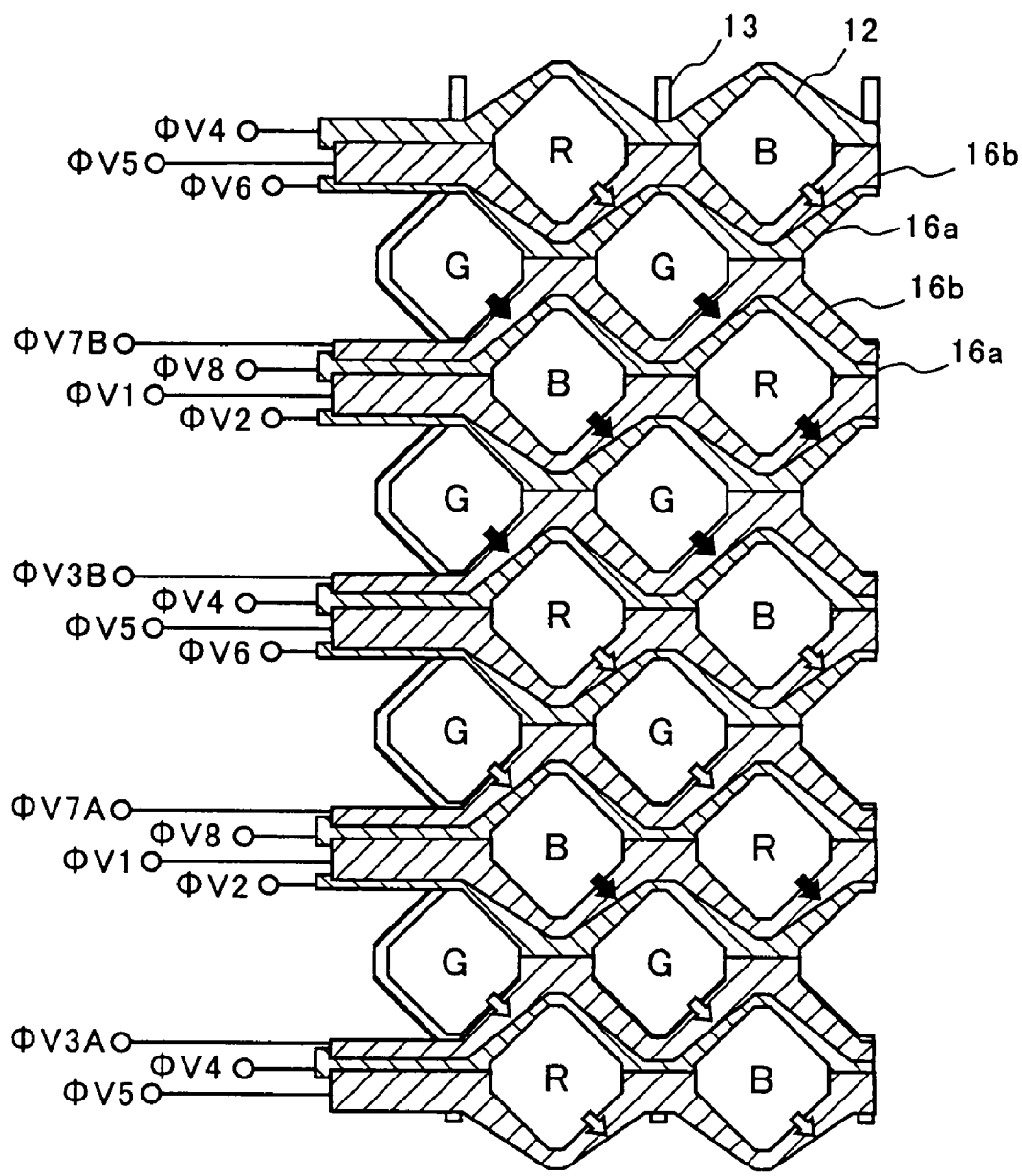
FIG. 3 is a plan view showing an electrode structure of the solid state imaging device 100 according to the first embodiment of the present invention.

In a space between the column of the photoelectric conversion element 12, a vertical electric charge transfer device 14 that reads out and vertically transfers the signal charge generated at the photoelectric conversion elements 12 is winding through spaces between the adjoining photoelectric conversion elements 12. A winding transfer channel is configured in the spaces formed by the pixel interleaved arrangement, and adjoining transfer channels separate further via the photoelectric conversion elements 12 and approach closer to each other via the channel stop region 13 (FIG. 3).

The vertical electric charge transfer device 14 is consisted of a vertical transfer channel (not shown in the drawing) and transfer electrodes (FIG. 3) formed above the vertical transfer channel via an insulating film (not shown in the drawing) and winds through the spaces between the photoelectric conversion elements 12 in a horizontal direction.

A color filter is formed above each photoelectric conversion element 12. In the drawing, G, B and R respectively indicate the color filter of green, blue and red.

In the drawing, pixel lines on lines indicated by white arrows are first field lines in an interlace scanning, and pixel lines on lines indicated by black arrows are second field lines.

When signals of the first field lines are read, the first G-lines and the second G-lines, and the fifth G-lines and the sixth G-lines are read. When signals of the second field lines are read, the third G-lines and the fourth G-lines, the seventh G-lines and the eighth G-lines are read. As shown in the drawing, each G-line is formed along with a solid line repeatedly connecting centers of the pixels.

For example, each of the first G-lines and the fifth G-lines is formed in sharply alternating directions along with a solid line repeatedly connecting centers of a G-pixel in the first column, an R-pixel in the second column adjoining to a lower right of the G-pixel in the first column, a G-pixel in the third column adjoining to an upper right of the R-pixel in the second column and a B-pixel in the fourth column adjoining to a lower right of the G-pixel in the third column.

Moreover, for example, each of the second G-lines and the sixth G-lines is formed in sharply alternating directions along with a solid line repeatedly connecting centers of a G-pixel in the first column, an R-pixel in the second column adjoining to a upper right of the G-pixel in the first column, a G-pixel in the third column adjoining to an lower right of the R-pixel in the second column and a B-pixel in the fourth column adjoining to a upper right of the G-pixel in the third column.

Furthermore, for example, each of the third G-lines and the seventh G-lines is formed in sharply alternating directions along with a solid line repeatedly connecting centers of a G-pixel in the first column, an B-pixel that is the closest to a lower right of the G-pixel in the first column, a G-pixel in the third column that is positioned on the same horizontal line as the G-pixel in the first column and a R-pixel in the fourth column that is the closest to a lower right of the G-pixel in the third column.

Also, for example, each of the fourth G-lines and the eighth G-lines is formed in sharply alternating directions along with a solid line repeatedly connecting centers of a G-pixel in the first column, an B-pixel in the second column adjoining to a lower right of the G-pixel in the first column, a G-pixel in the third column adjoining to an upper right of the B-pixel in the second column and a R-pixel in the fourth column adjoining to a lower right of the G-pixel in the third column.

FIG. 2A to FIG. 2D are diagrams showing signal arrangements read by the solid state imaging device 100 according to the first embodiment of the present invention.

FIG. 2A is a diagram showing a signal arrangement of the first field, and FIG. 2B is a diagram showing a signal arrangement of the second field. G-lines adjoining each other to vertical direction exist in each field. In this embodiment, these adjoining G-lines are added vertically. That is, the first G-lines and the second G-lines, the fifth G-lines and the sixth G-lines are respectively added in the first field, and the third G-lines and the fourth G-lines, and the seventh G-lines and the eighth G-lines are respectively added in the second field. As a result, as shown in FIG. 2C, a signal arrangement of a vertical two-pixel addition field synthesized frame generated by synthesizing each field after the vertical additions can be obtained.

FIG. 2D is a diagram showing spatial sampling centers after the vertical additions. In this embodiment, because the G-lines (the signals of the G-pixels) that are originally vertically adjoining are added, centers of the sampling points of G in a vertical direction after the field synthesis will be on a line indicated by white arrows after the vertical addition for the first field and on lines indicated by black arrows after the vertical addition for the second field. Therefore, as shown in FIG. 2D, the centers of the sampling points are arranged with regular vertical intervals.

Moreover, since each of the spatial sampling regions does not overlap with others, maximum resolution decided by the number of the spatial sampling points can be obtained.

FIG. 3 is a plan view showing an electrode structure of the solid state imaging device 100 according to the first embodiment of the present invention.

The transfer electrodes 16 have a well-known double-layered structure, and each of them is consisted of a first layer electrode 16a and a second layer electrode 16b. The photoelectric conversion elements (pixels) 12 perform photoelectric conversion and accumulate electric charges, and colors of the color filter corresponding to the pixels are presented by putting letters "R", "G" and "B" in each pixel 12 in the drawing.

On the left of the drawing, phases of transferring pulses provided to electrodes are indicated with $\Phi V1$ to $\Phi V8$ an eight-phase driving method in which one transfer unit is consisted of eight electrodes (four electrodes for each pixel) is used in a normal interlace operation in the solid state imaging device with pixel interleaved arrangement.

First, when a high-level pulse is imposed on the second layer electrodes 16b to which an odd number phase pulses are imposed, the signal charges accumulated in the pixels 12 are transferred to regions under the transfer electrodes on the read-out channel 18 side (a direction without the channel stop 19) as indicated by arrows. That is, when $\Phi V1$ becomes high level, the signals of the B-pixels are transferred, and when $\Phi V3A$, $\Phi V3B$, $\Phi V7A$ and $\Phi V7B$ become high level, the signals of the G-pixels are transferred.

A structural difference in the electrode structure between this embodiment and the prior art is that $\Phi V3$ is imposed by using two electrically independent lines of $\Phi V3A$ and $\Phi V3B$, and $\Phi V7$ is imposed by using two electrically independent lines of $\Phi V7A$ and $\Phi V7B$. By doing that, in each of the first and the second fields, the signals of the two G-lines (for example, the first G-lines and the second G-lines) adjoining in a vertical direction can selectively transferred and added.

More in detail, by making $\Phi V3A$, $\Phi V7A$ and $\Phi V5$ high level in the first field, electric charges are transferred from the pixels 12 to the transfer electrodes 16 as shown with white arrows in the drawing, and the signal arrangement shown in FIG. 3A can be obtained. Also, as same as the above, by making ΦV3B, ΦV7B and ΦV1 high level in the second field, electric charges are transferred from the pixels 12 to the transfer electrodes 16 as shown with black arrows in the drawing, and the signal arrangement shown in FIG. 3B can be obtained.

As described in the above, according to the first embodiment of the present invention, without cutting any horizontal signal lines, an image signals for both motion picture and still picture can be easily generated with double sensitivity and half vertical resolution.

Figure 4A:
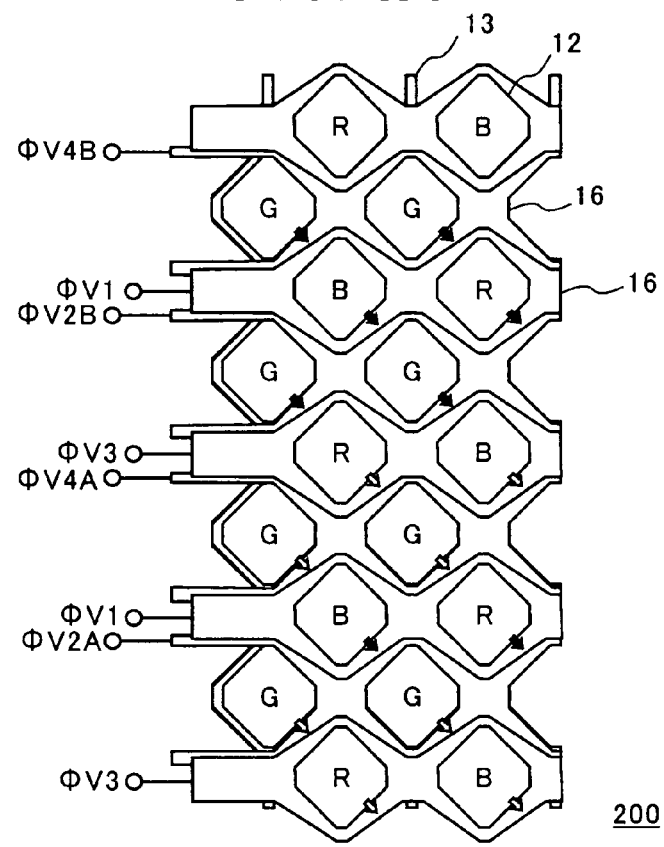
FIG. 4A and FIG. 4B are plan views showing electrode structures of the solid state imaging device 200 according to a second embodiment of the present invention.
Figure 4B:
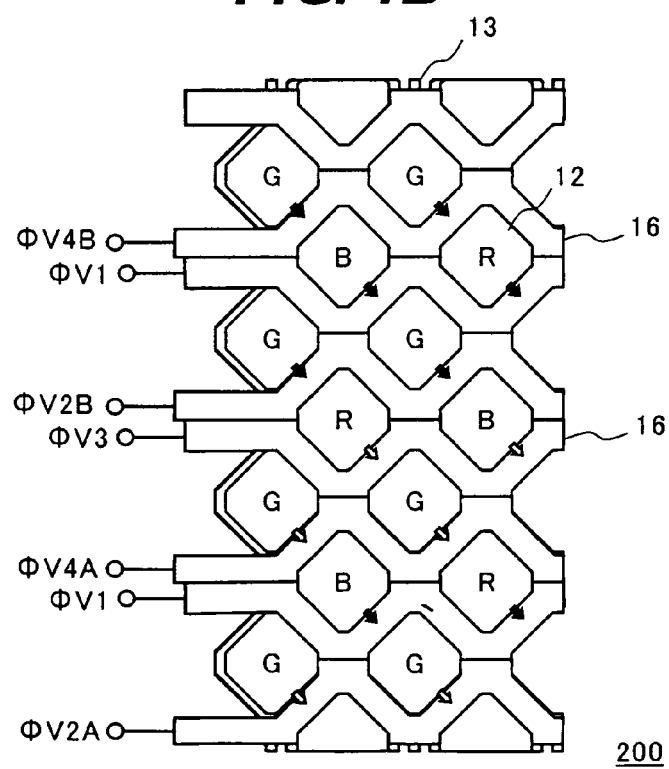

FIG. 4A and FIG. 4B are plan views showing examples of an electrode structure of the solid state imaging device 200 according to a second embodiment of the present invention.

The difference from the first embodiment is that a four-phase driving method in which one transfer unit is consisted of four electrodes (two electrodes for each pixel) is used in both of the structures shown in FIG. 4A and FIG. 4B.

In both of the structures shown in FIG. 4A and FIG. 4B, by making ΦV2A, ΦV4A and ΦV3 high level in the first field, electric charges are transferred from the pixels 12 to the transfer electrodes 16 as shown with white arrows in the drawing, and the signal arrangement shown in FIG. 3A can be obtained. Also, as same as the above, by making ΦV2B, ΦV4B and ΦV1 high level in the second field, electric charges are transferred from the pixels 12 to the transfer electrodes 16 as shown with black arrows in the drawing, and the signal arrangement shown in FIG. 3B can be obtained.

As described in the above, according to the second embodiment of the present invention, without cutting horizontal signal lines, an image signal for both motion picture and still picture can be easily generated with double sensitivity and half vertical resolution.

Figure 5:
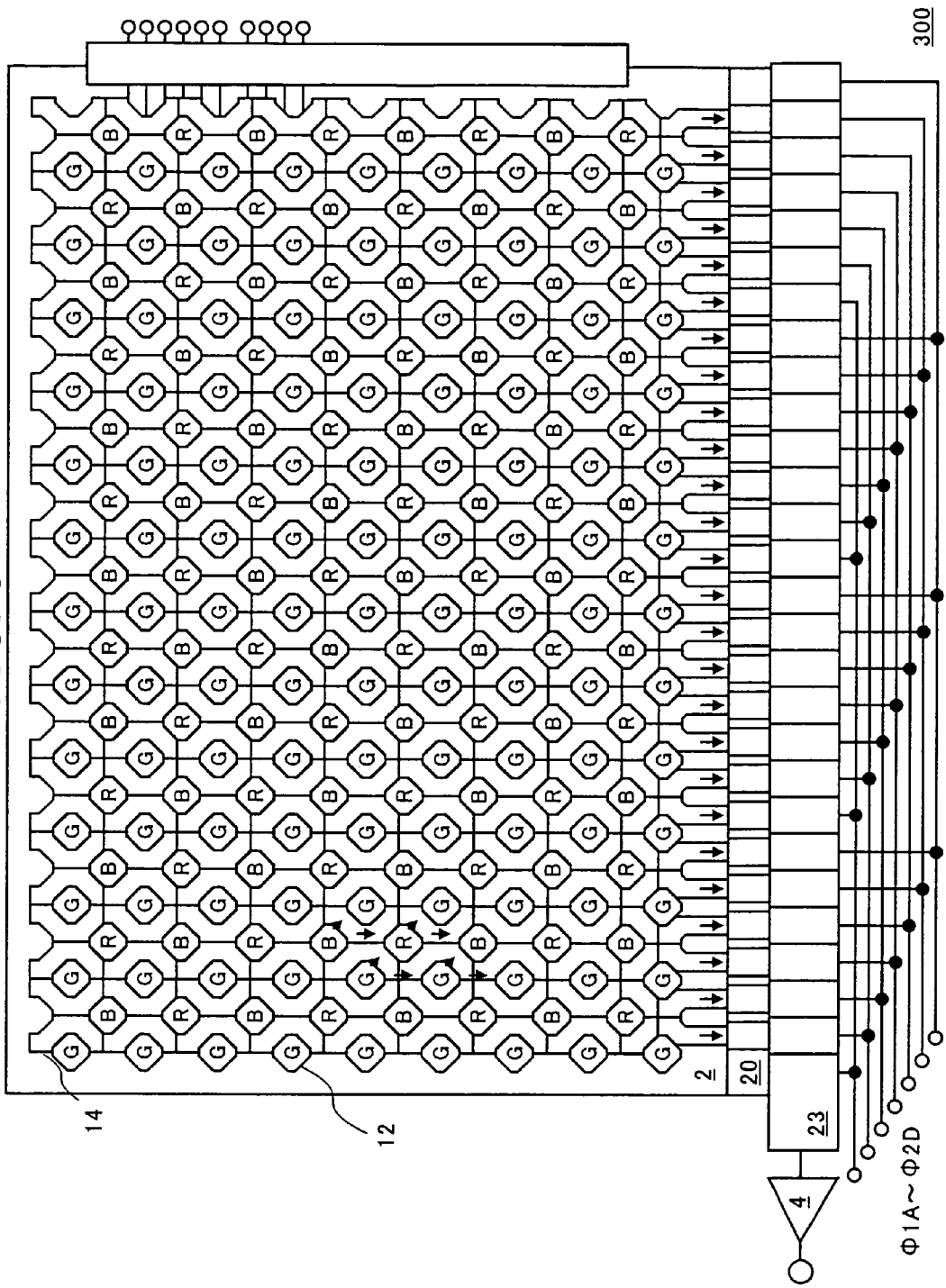
FIG. 5 is a schematic plan view of the solid state imaging device 300 according to a third embodiment of the present invention.

FIG. 5 is a schematic plan view of the solid state imaging device 300 according to a third embodiment of the present invention.

Differences from the first embodiment and the second embodiment are points that a line memory 20 connected with the transfer channel of the vertical electric charge transfer device 14 is provided and a horizontal addition circuit 23 including an eight-phase driving horizontal transferring CCD (HCCD) is provided.

Moreover, an embodiment in a specification of Japanese Patent Application No. 2000-295896 (Japanese Laid-Open Patent 2002-112119) filed by the same applicant as this invention is herein incorporated by reference for details of the horizontal addition method by the horizontal addition circuit 23.

First, as shown in FIG. 6A, signal charges in the first field are read out to the electric charge transfer devices 14, and the signal charges of two lines adjoining to vertical direction are added in the electric charge transfer device 14 or in the line memory 20.

Next, as shown in FIG. 6B, the horizontal addition circuit 23 adds G-signals horizontally adjoining to each other, adds the closest R-signals, and adds the closest B-signals.

Thereafter, as shown in FIG. 6C, the signal charges in the second field are read out to the electric charge transfer devices 14, and the signal charges of two lines adjoining to vertical direction are added in the electric charge transfer devices 14 or the line memory 20.

Next, as shown in FIG. 6D, the horizontal addition circuit 23 adds G-signals horizontally adjoining to each other, adds the closest R-signals, and adds the closest B-signals.

Finally, as shown in FIG. 6E, each of the first field and the second field signals obtained by the signal additions shown in FIG. 6C and FIG. 6D is synthesized and defined as one frame signal. In this third embodiment, the signal additions are executed once in a vertical direction and once in a horizontal direction, that is the signal additions are executed twice as a whole. Therefore, the signal electric charge for one display pixel finally obtained will be four times of that generated by one pixel.

Therefore, in the third embodiment, by the above described operations of the vertical and horizontal additions, each of the vertical and horizontal resolutions will be decreased to a half of the original signals, and sensitivity will be increased to four times of the original signals. Also, since the number of display pixels is decreased to ¼, a frame rate can be increased to four times at the same data rate (a reading clock frequency).

Figure 7:
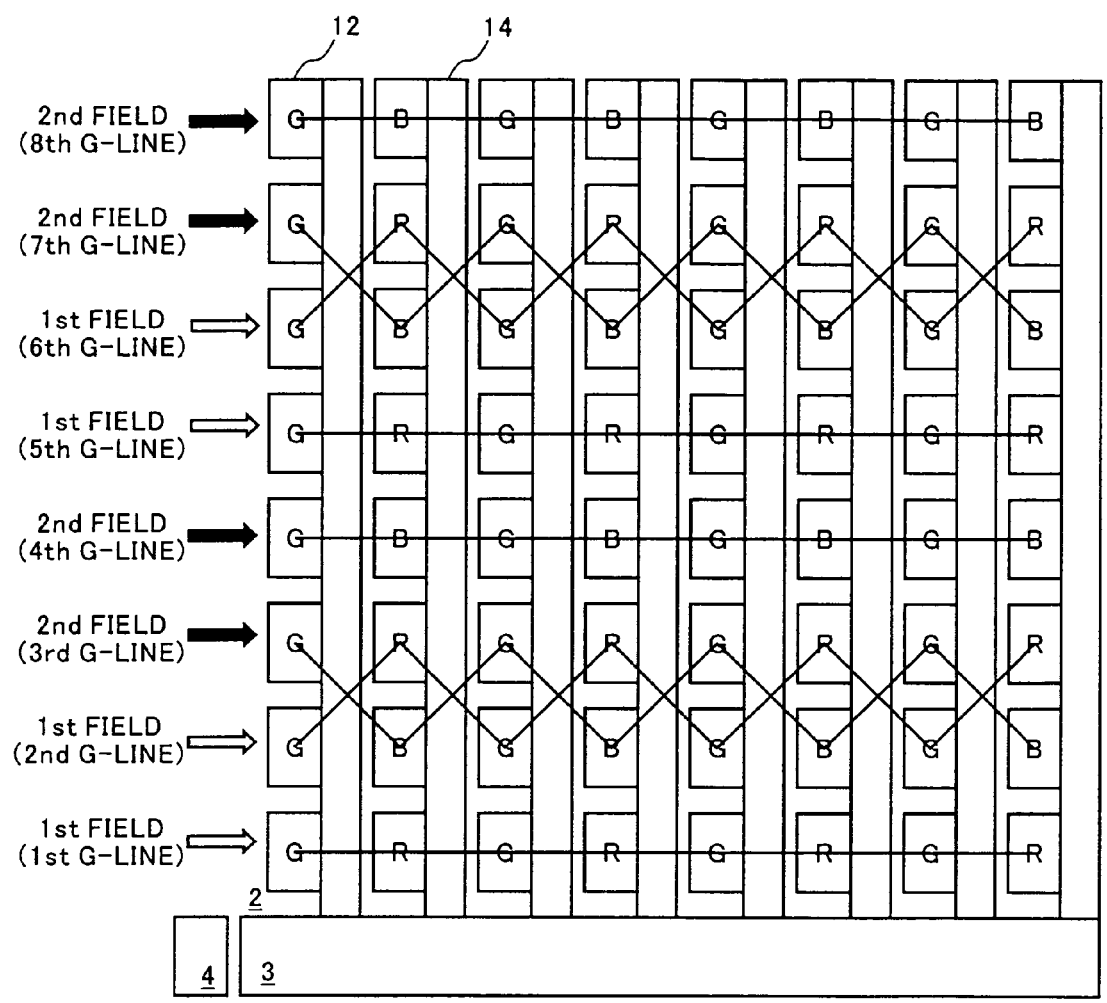
FIG. 7 is a schematic plan view of a solid state imaging device 400 according to a fourth embodiment of the present invention.

FIG. 7 is a schematic plan view of a solid state imaging device 400 according to the fourth embodiment of the present invention.

Structural differences between this fourth embodiment and the first embodiment are a point that the photoelectric conversion element 12 in the light receiving region 2 is arranged in a tetragonal matrix and a color filter arrangement.

In the fourth embodiment, a large number of photoelectric conversion elements 12 are arranged in a tetragonal matrix in the light receiving region 2. In each space between the columns of photoelectric conversion elements 12, a vertical electric charge transferring circuit (VCCD) 14 that reads the signal charges generated at the photoelectric conversion elements 12 and transfers them to a vertical direction is formed. The VCCD 14 includes the vertical transfer channel and transfer electrodes 16 and transfers the signal charges generated at the photoelectric conversion elements 12 to a vertical direction.

In the drawing, under the light receiving area 2 as same as the first embodiment, a horizontal electric charge transferring circuit (HCCD) 3 that transfers every line of the signal charges transferred by the VCCD to a peripheral circuit 4 is formed.

When the embodiments of the present invention is applied for the ITCCD in a tetragonal matrix, as shown in the drawing in the fourth embodiment, "G-stripe and RB spots alternating type" is preferable rather than the general Bayer Arrangement.

In the drawing, pixel lines on lines indicated with white arrows are first field lines in the interlace scanning, and pixel lines on lines indicated with black arrows are second field lines.

When the signals of the first field lines are read out, the first G-lines and the second G-lines, and the fifth G-lines and the sixth G-lines are read. When the signals of the second field lines are read out, the third G-lines and the fourth G-lines, the seventh G-lines and the eighth G-lines are read out. As shown in the drawing, each G-line is formed along with a straight line connecting centers of the pixels or a winding line repeatedly connecting centers of pixels.

For example, the first G-lines and the fifth G-lines are consisted of straight lines. That is, each of the first G-line and the fifth G-line is formed along with a solid line connecting the centers of G-pixel in the first column, the R-pixel in the second column adjoining to the G-pixel in the first column, the G-pixel in the third column adjoining to the R-pixel in the second column and the R-pixel in the fourth column adjoining to the G-pixel in the third column (thereafter, this arrangement is repeated to the last column).

Moreover, for example, each of the second G-line and the sixth G-line is formed by a line sharply alternating directions along with a solid line repeatedly connecting centers of the G-pixel in the first column, the R-pixel in the second column adjoining to a upper right of the G-pixel in the first column, the G-pixel in the third column adjoining to an lower right of the R-pixel in the second column and a B-pixel in the fourth column adjoining to a upper right of the G-pixel in the third column.

Also, for example, the fourth G-line and the eighth G-line are consisted of straight lines. That is, they are formed along with a solid line connecting the centers of the G-pixel in the first column, the B-pixel in the second column adjoining to the G-pixel in the first column, the G-pixel in the third column adjoining to the B-pixel and the B-pixel in the fourth column adjoining to the G-pixel in the third column (hereinafter a repeat of this arrangement).

Furthermore, for example, each of the third G-line and the seventh G-line is formed by a line sharply alternating directions along with a solid line repeatedly connecting centers of a G-pixel in the first column, an B-pixel in the second column adjoining to a lower right of the G-pixel in the first column, a G-pixel in the third column adjoining to an upper right of the B-pixel in the second column and a B-pixel in the fourth column adjoining to a lower right of the G-pixel in the third column.

FIG. 8A to FIG. 8D are diagrams showing signal arrangements read by the solid state imaging device 400 according to the fourth embodiment of the present invention.

FIG. 8A is a diagram showing a signal arrangement of the first field, and FIG. 8B is a diagram showing a signal arrangement of the second field. G-lines adjoining each other to vertical direction exist in each field. In this embodiment, these adjoining G-lines are added vertically. That is, the first G-lines and the second G-lines, the fifth G-lines and the sixth G-lines are respectively added in the first field, and the third G-lines and the fourth G-lines, and the seventh G-lines and the eighth G-lines are respectively added in the second field. As a result, as shown in FIG. 8C, a signal arrangement of a vertical two-pixel addition field synthesized frame generated by synthesizing each field after the vertical additions can be obtained.

FIG. 8D is a diagram showing spatial sampling centers after the vertical additions. In this embodiment, because the G-lines (the signals of the G-pixels) that are originally vertically adjoining are added, centers of the sampling points of G in a vertical direction after the field synthesis will be on a line indicated by white arrows after the vertical addition for the first field and on lines indicated by black arrows after the vertical addition for the second field. Therefore, as shown in FIG. 8D, the centers of the sampling points are arranged with regular vertical intervals.

Moreover, since each of the spatial sampling regions does not overlap with others, maximum resolution decided by the number of the spatial sampling points can be obtained.

Figure 9A:
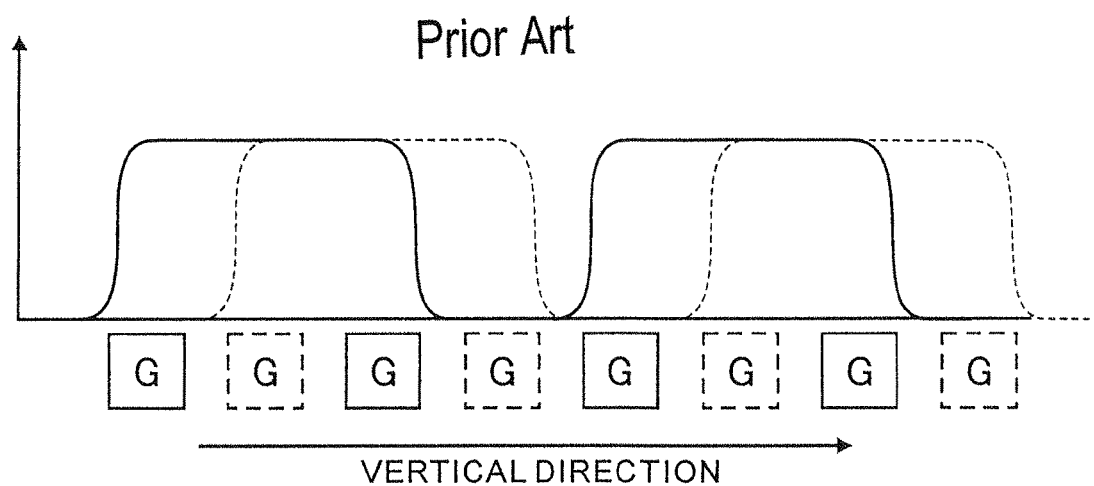
FIG. 9A and FIG. 9B are graphs for comparing spatial resolution of the first to fourth embodiments of the present invention with spatial resolution of the prior art.
Figure 9B:
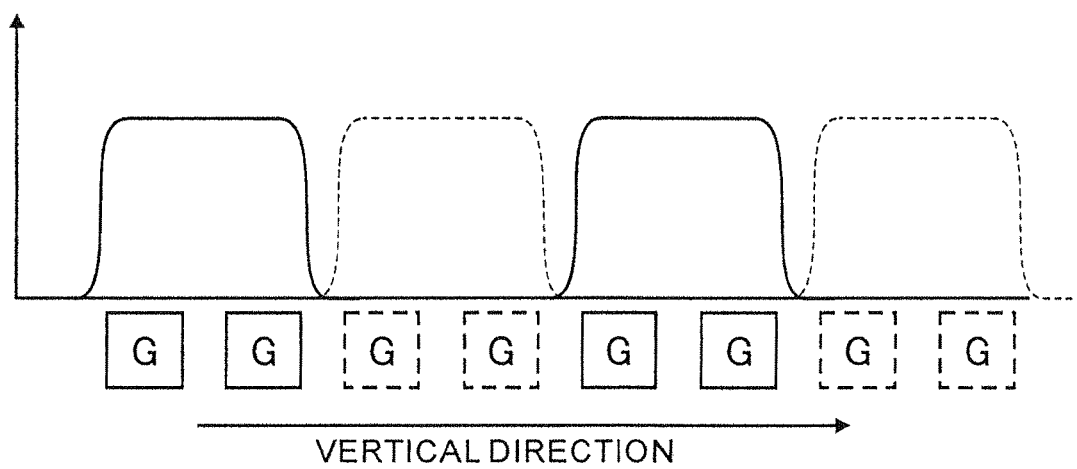
Figure 10:
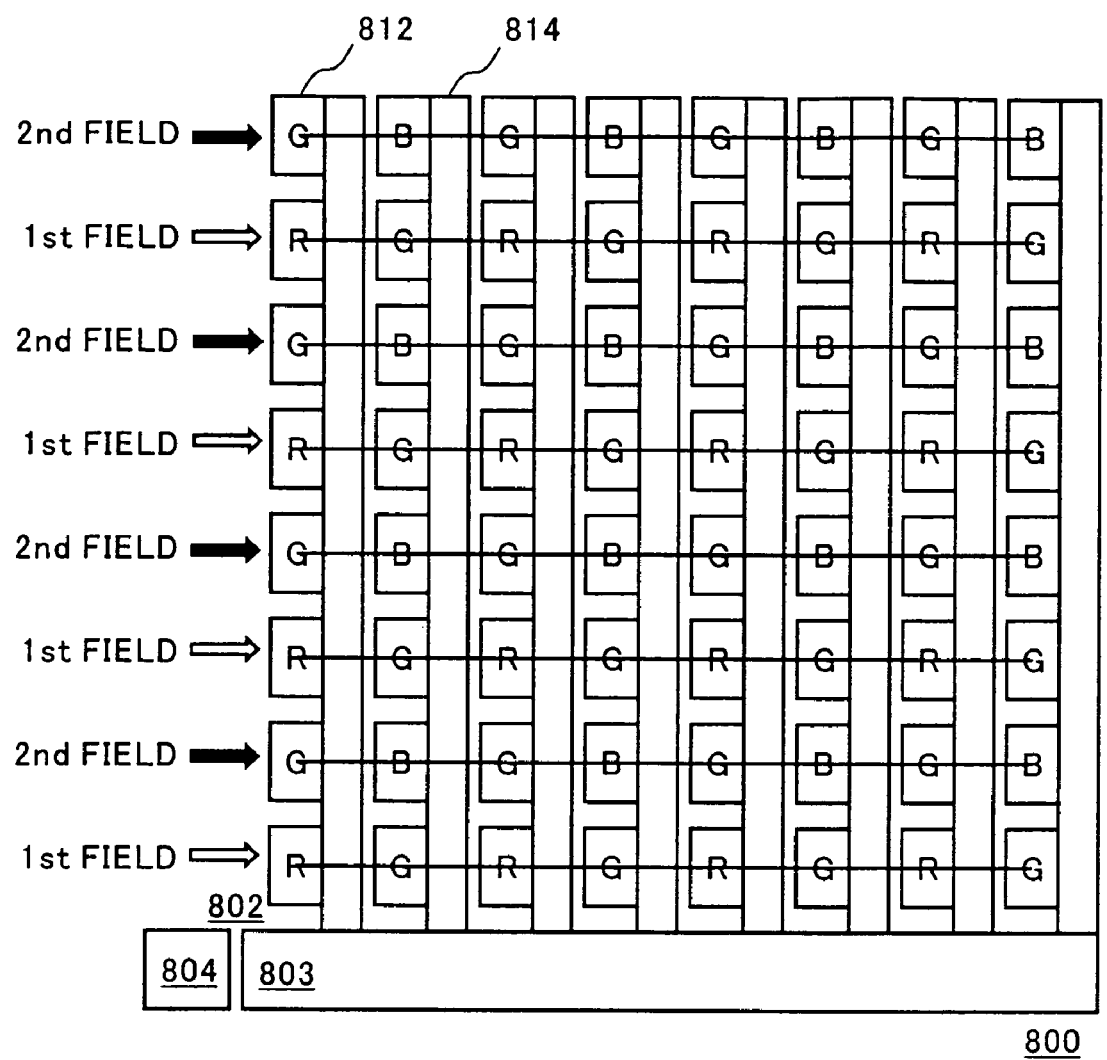
FIG. 10 is a schematic plan view of a conventional solid state imaging device 800.
Figure 11:
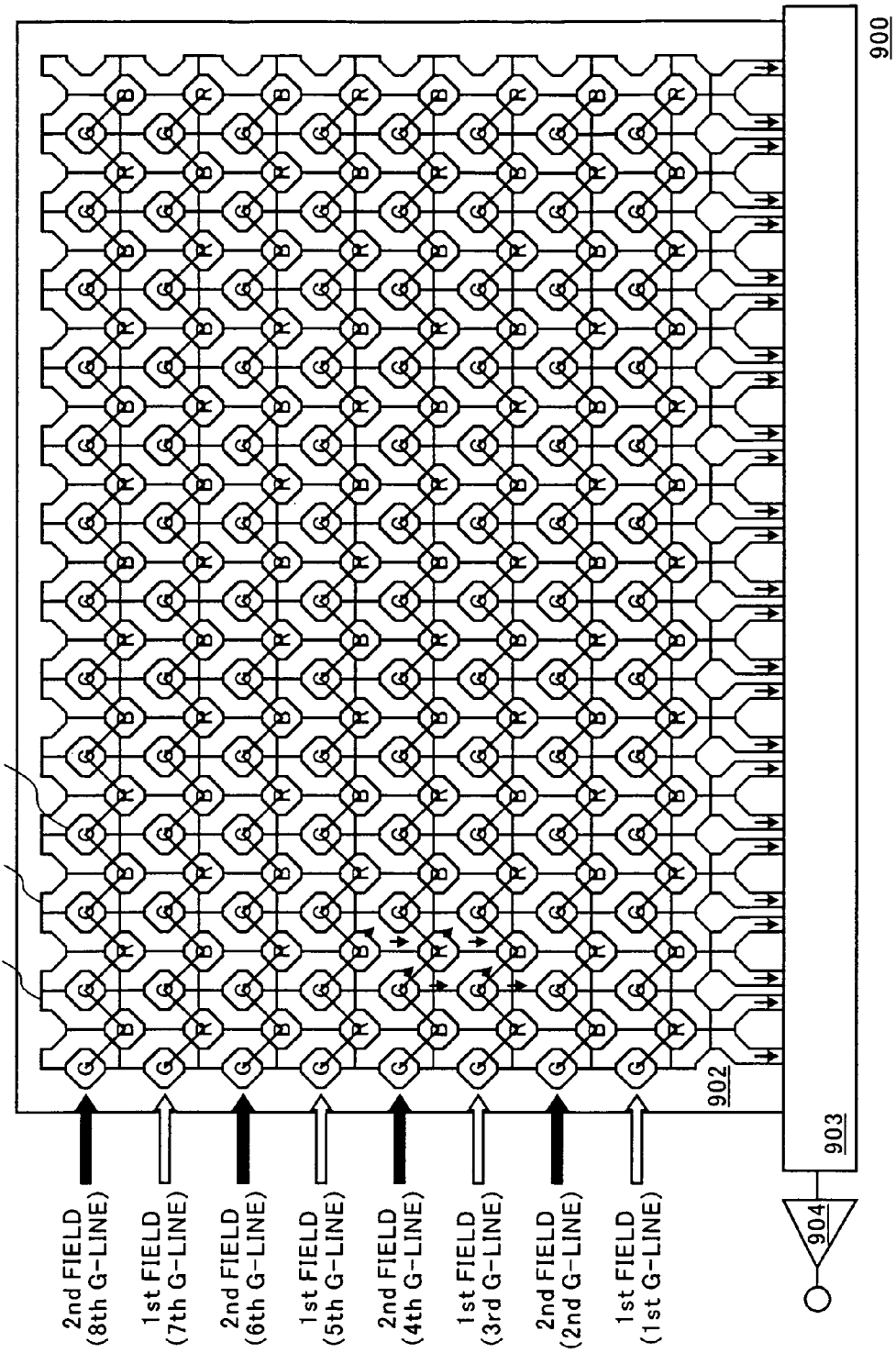
FIG. 11 is a schematic plan view of a conventional solid state imaging device 900.
Figures 13A, 13B, 13C, 13D:
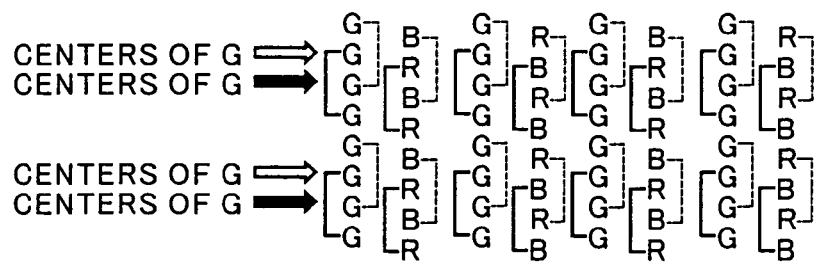
FIG. 13A to FIG. 13D are diagrams showing signal arrangements read by the conventional PIACCD solid state imaging device 900.

FIG. 9A and FIG. 9B are graphs for comparing a spatial resolution of either one of the first to fourth embodiments of the present invention with a spatial resolution of the prior art.

FIG. 9A shows a spatial sampling response obtained by the conventional vertical additions, and FIG. 9B shows a spatial sampling response obtained by vertical additions according to either one of the first to fourth embodiments of the present invention. In the graph si solid lines indicate the spatial sampling responses in a first field, and dotted lines indicate the spatial sampling responses in a second field. As shown in the graphs, by adapting either one of the first to fourth embodiments of the present invention, the spatial resolution will be about twice of the conventional vertical additions.

As described in the above, according to the first to fourth embodiments of the present invention, by adding the signal electric charges of vertically adjoining signal lines, vertical resolution after the additions can be raised as much as possible.

Also, by adding the same colored signals, sensitivity can be raised in proportion to the number of addition times. Moreover, the frame rate can be raised corresponding to the number of the addition times.

Furthermore, since the number of the effective pixels can be decreased without cutting signals of any pixels, usage efficiency of the signals can be raised.

Further, although the signals are read out in two steps such as the first field and the second field, it is not limited to that. For example, the signals can be read out in three steps such as the first to the third steps, and one frame signal can be generated by synthesizing the signals in the first to the third fields. In this case, for example, the first G-lines, the second G-lines, the seventh G-lines and the eighth G-lines are read out as the signals in the first field, the third G-lines, the fourth G-lines, the ninth G-lines and the tenth G-lines are read out as the signals in the second field, and the fifth G-lines, the sixth G-lines, the eleventh G-lines and the twelfth G-lines are read out as the signals in the third field.

Moreover, the signal electric charges of the vertically adjoining G-pixel are added in the above-described first to fourth embodiments on the assumption that the G (green)-pixels define the resolution; however, the signal charges of the vertically adjoining pixels in other colors may be added. The other colors are not only R (red) and B (blue), but also, for example, white, etc.

Moreover, the embodiments has been explained by using the CCD-type solid state imaging device as examples, it is not limited to the CCD-type solid state imaging device. For example, a CMOS-type solid state imaging device can be adapted for the present invention.

The present invention has been described in connection with the preferred embodiments. The invention is not limited only to the above embodiments. It is apparent that various modifications, improvements, combinations, and the like can be made by those skilled in the art.

What are claimed are:

1. A solid state imaging device comprising:
    a semiconductor substrate defining a two-dimensional surface;
    a plurality of photoelectric conversion elements disposed in a light receiving area of said semiconductor substrate in a plurality of rows and columns;
    an electric charge read-out device that reads out signal electric charges accumulated in said plurality of photoelectric conversion elements in interlace by dividing the signal electric charges in a plurality of fields, each field including at least the signal electric charges accumulated in vertically adjacent photoelectric conversion elements corresponding to green (G) in two vertically adjoining G-lines; and
    a vertical adding device that adds, for each field, the read-out signal electric charges divided into the plurality of fields, wherein said signal electric charges accumulated in the vertically adjacent photoelectric conversion elements corresponding to green (G) in the vertically adjoining G-lines are added with each other.

2. The solid state imaging device according to claim 1, wherein said plurality of fields comprise a first field including signal electric charges read out from almost half number of said plurality of photoelectric conversion elements and a second field including signal electric charges read out from remaining number of said plurality photoelectric conversion elements.

3. The solid state imaging device according to claim 1, wherein said vertical adding device vertically adds same color signals of each field including at least the signal electric charges accumulated in the vertically adjacent photoelectric conversion elements corresponding to green.

4. The solid state imaging device according to claim 1, wherein said plurality of photoelectric conversion elements are arranged in each of grids of a first tetragonal matrix and grids of a second tetragonal matrix that has grids on a center of the grids of the first tetragonal matrix.

5. The solid state imaging device according to claim 4, wherein green (G) pixels are arranged on the grids of the first tetragonal matrix, and red (R) pixels and blue (B) pixels are alternatively arranged on the grids of the second tetragonal matrix.

6. The solid state imaging device according to claim 1, further comprising a horizontal adding device that horizontally adds signal electric charges in a same color vertically added for each field.

7. The solid state imaging device according to claim 1, further comprising a frame generator that generates an image for one frame by synthesizing the signal electric charges of said plurality of fields in time and space.

* * * * *